United States Patent
Pan

(10) Patent No.: US 7,029,537 B2
(45) Date of Patent: *Apr. 18, 2006

(54) METHOD OF PROCESSING SELECTED SURFACES IN A SEMICONDUCTOR PROCESS CHAMBER BASED ON A TEMPERATURE DIFFERENTIAL BETWEEN SURFACES

(75) Inventor: James Pan, Colorado Springs, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/050,998

(22) Filed: Feb. 4, 2005

(65) Prior Publication Data

US 2005/0150448 A1    Jul. 14, 2005

Related U.S. Application Data

(62) Division of application No. 10/102,304, filed on Mar. 19, 2002, now Pat. No. 6,881,277, which is a division of application No. 09/246,611, filed on Feb. 8, 1999, now Pat. No. 6,395,099.

(51) Int. Cl.
B08B 7/04 (2006.01)

(52) U.S. Cl. .............. 134/19; 134/1; 134/22.1

(58) Field of Classification Search ............... 134/1, 134/1.1, 1.2, 19, 22.1, 22.18; 438/905; 156/345.37, 156/345.5

See application file for complete search history.

(56) References Cited

U.S. PATENT DOCUMENTS

| | | | | |
|---|---|---|---|---|
| 5,421,957 A | * | 6/1995 | Carlson et al. | ............... 216/58 |
| 5,785,796 A | * | 7/1998 | Lee | ........................ 156/345.24 |
| 5,855,677 A | * | 1/1999 | Carlson et al. | ............. 118/666 |
| 6,395,099 B1 | * | 5/2002 | Pan | ............................. 134/19 |
| 6,881,277 B1 | * | 4/2005 | Pan | ............................. 134/19 |

* cited by examiner

*Primary Examiner*—Alexander Markoff
(74) *Attorney, Agent, or Firm*—Ganz Law, P.C.

(57) ABSTRACT

The present invention relates to a method of processing selected surfaces in a semiconductor process chamber by creating a temperature differential between the selected surfaces and contacting the surfaces with a reactant that preferentially react with a surface at one end of the temperature differential relative to the other selected surface(s). More particularly, the invention relates to the use of nitrogen trifluoride ($NF_3$) gas for in situ cleaning of cold wall process chambers such as Rapid thermal Chemical Vaporization ("RTCVD") systems.

22 Claims, 7 Drawing Sheets

METHOD OF PROCESSING SELECTED SURFACES IN A SEMICONDUCTOR PROCESS CHAMBER BASED ON A TEMPERATURE DIFFERENTIAL BETWEEN SURFACES

This application is a divisional of U.S. patent application Ser. No. 10/102,304, filed Mar. 19, 2002 now U.S. Pat. No. 6,881,277, which is a divisional of U.S. patent application Ser. No. 09/246,611, filed Feb. 8, 1999 now U.S. Pat. No. 6,395,099. The priority of these prior applications is expressly claimed and their disclosures are hereby incorporated by reference in their entirety.

BACKGROUND OF THE INVENTION

The present invention relates to a method of processing a selected surface in a semiconductor process chamber by contacting the selected surface with a reactant that reacts preferentially with the selected surface relative to another surface when the selected surface is at a different temperature from the other surface. The invention is particularly suited for use in rapid thermal processing (RTP) systems. More particularly, the invention relates to the use of nitrogen trifluoride ("$NF_3$") gas to clean selected surfaces in RTP process chambers, including in Rapid Thermal Chemical Vapor Deposition (RTCVD) process chambers.

During the course of semiconductor device fabrication, a wafer undergoes many steps of processing. Some steps involve heating the wafer hundreds of degrees Celsius above ambient temperature. Unnecessary heating may lead to defective devices being formed on the wafer. One reason for this is that heat causes substances, such as implanted ions, to migrate outside their intended location on the wafer. Migration and other things affected by heating are compounded by the length of heating time and by the number of heat steps. To avoid the problems associated with wafer heating, it is advantageous to use processes that minimize the time that a wafer is kept at an elevated temperature. This is the principle of conserving the thermal budget of the wafer.

In a conventional process chamber using a tube furnace, for example, it might take several minutes to raise the temperature of the wafer to a desired level. Because the walls and other surfaces in such process chambers are directly heated along with the wafer, such systems can be referred to as "hot wall" systems. The heated walls and other surfaces in the chamber also increase the wafer's cooling time. Thus, in hot wall process chambers a wafer may be subject to prolonged heating and cooling.

In contrast, RTP process chambers use a radiant energy source, such as high intensity lamps, to rapidly heat a wafer to a desired temperature in a matter of seconds. The energy source may raise the wafer's surface temperature by 75–125° C. per second. Other surfaces in the chamber are not generally heated by the radiant energy—for example quartz liners and windows in the chamber may be transmissive of the radiant energy frequencies or the energy may not be directed onto the surfaces. Because the radiant energy source does not directly heat these surfaces, RTP systems may be referred to as "cold wall" systems.

Because the rapid heating and cooling in RTP systems conserve a wafer's thermal budget, it was expected that RTP systems would be widely adopted for every heat-based process. However, RTP systems have certain disadvantages that have not been adequately addressed. One significant disadvantage is that radiant energy may not be absorbed uniformly by a wafer. This results in temperature variations in and across the wafer. Temperature variations lead to non-uniform process results. RTP systems therefore require sensitive systems for monitoring and controlling the temperature of the wafer. One useful system uses a parallel plate with a reflective coating that reflects energy to the backside of the wafer. An optic fiber collects and transmits the wafer's backside emissivity to a detector that translates the frequencies of energy to a temperature reading. Unfortunately, a significant disadvantage of this temperature monitoring system is its vulnerability to certain cleaning processes carried out in an RTP process chamber.

This problem and certain others addressed by the present invention are illustrated in the following example: the deposition of polysilicon on a wafer in an RTCVD process chamber. Deposition of polysilicon is a known step in the fabrication of certain semiconductor devices. One notable process using polysilicon is the formation of hemispherical grained silicon ("HSG"). HSG formations enhance the storage capacitance in storage devices such as Dynamic Random Access Memory Arrays ("DRAMS"). Poor, irregular HSG formations result in unclean RTCVD process chambers. (Methods for forming HSG are described, for example, in U.S. Pat. Nos. 5,634,974 and 5,759,262 which are hereby incorporated by reference as if set forth in their entirety.)

An undesired side effect from polysilicon deposition is that the polysilicon is deposited not only on the wafer but also on other surfaces in the process chamber. For example, in RTCVD process chambers, it accumulates on, among other things, the top quartz window and quartz liner of the chamber. A build-up of polysilicon impedes the transmission of radiant energy through the window onto the wafer. It may also lead to high particle counts in the chamber, lowering production yields. Therefore, periodic cleaning of the process chamber is necessary.

$NF_3$ is a powerful etchant, effectively etching polysilicon and certain other substances used in semiconductor processing. Use of $NF_3$ for in-situ cleaning of a non-RTP semiconductor process chambers is described in U.S. Pat. No. 5,797,195, to Hulling et al, entitled "Nitrogen Trifluoride Thermal Cleaning Apparatus and Process." The '195 patent describes a "hot wall" system for cleaning semiconductor fabrication equipment, including quartzware parts. $NF_3$ gas is heated from approximately 100° C. to 650° C. by the existing heat source for the process chamber. At the same time, the heat source also heats the other surfaces in the process chamber, which surfaces the $NF_3$ gas is free to contact. The '195 patent does not teach or suggest that the described cleaning system is suitable for use in "cold wall", RTP systems, including RTCVD systems.

It would be desirable to use $NF_3$ gas to clean RTP process chambers, particularly those used to deposit polysilicon in HSG production. However, $NF_3$'s high reactivity has so far limited its usefulness in this regard. $NF_3$ cleaning, until the present invention, has not proved suitable for use in cold wall systems, such as RTCVD systems, because certain components in RTCVD chambers may be damaged by the high activity of $NF_3$ at higher temperatures.

As the temperature of $NF_3$ increases, its reactivity increases, converting to reactive species in the form of ionic fluorine and/or free fluorine. The temperatures that occur in RTCVD processing can exceed 750° C. At such temperatures, $NF_3$ is so corrosive that it attacks stainless steel, quartz, and silicon surfaces, damaging critical components found in RTCVD process chambers. As mentioned, temperature-monitoring systems based on wafer emissivity are particularly vulnerable to damage. $NF_3$'s action on such unintended targets may also create unacceptably high particle counts in the process chamber, lowering production yields.

If the $NF_3$ cleaning is performed at lower temperatures, the etching rate is too low to effectively clean the system. This is because most of the hardware inside the process chamber, including the top quartz window, is heated by heat transmitted from the wafer, not by light used to heat the wafer. Therefore, if the temperature of the wafer is low, the top quartz window is even cooler. This results in unacceptably low etching rates.

For the foregoing reasons, a method is needed that allows a reactant introduced into an RTP process chamber to act preferentially on certain surfaces. Among other things, such an improved method would allow strong etchants, such as $NF_3$, to clean polysilicon deposits from process chambers without damaging sensitive components in the chamber.

SUMMARY OF THE INVENTION

The present invention overcomes the disadvantages of the prior art by providing a method by which a reactant may favor a reaction with selected surfaces in a semiconductor process chamber. In so doing, the present invention overcomes the problem of using a reactant that would act desirably on some surfaces and detrimentally on other surfaces.

The present invention provides a method that will facilitate the cleaning of RTP process chambers, thereby better facilitating the adoption and use of RTP systems. More particularly, the present invention overcomes the inherent disadvantages of using a powerful etchant, such as $NF_3$ gas to clean an RTP process chamber.

The present invention also overcomes the problems of high particle counts and lowered production yields that result if $NF_3$ gas or other strong etchant is used to clean RTP process chambers. Accordingly, the present invention also improves the process of HSG formation in RTP process chambers.

In overcoming the aforementioned disadvantages in the art, the present invention improves the efficiency and yield of semiconductor device production. Particularly, it improves the efficiency and yield of producing devices in RTP process chambers. More particularly, it improves the efficiency and yield of producing HSG formations on wafers using RTCVD systems.

One embodiment of the invention is a method of processing surfaces in a semiconductor process chamber, comprising: selecting two different surfaces in the process chamber, each surface at a given temperature being capable of reacting with a reactant introduced into the chamber; creating a predetermined temperature differential between the selected surfaces by allowing a heated object in the chamber to transfer heat to one selected surface so that that surface becomes the surface at the higher end of the temperature differential; contacting the selected surfaces with a reactant present in the chamber during the predetermined temperature differential between the selected surfaces; and allowing sufficient time for the reactant to react preferentially with one surface to a predetermined degree. The reactant may be removed from the chamber after the reactant has reacted with a surface to a predetermined degree.

A method according to the present invention may also include repeating the foregoing steps following the processing of a predetermined number of work objects in the chamber. The foregoing method also provides for the removal of deposits composed substantially of polysilicon from the surface at the higher end of the temperature differential.

In the embodiments of the present invention, a selected surface at the lower end of the temperature differential may be cooled by a cooling means. The cooling means may be a fluid cooling system in conductive communication with the surface at the lower end of the temperature differential. Components of a temperature measurement system in the process chamber may be cooled to protect them against action by an etchant or other reactant.

The present invention may provide for the process chamber to include a reflectivity plate comprising a selected surface. The reflectivity plate is kept at the lower end of the temperature differential during cleaning by an $NF_3$ gas or other etchant. By keeping the reflectivity plate at a lower temperature, it is protected from being damaged by an etchant that prefers reacting with other surfaces in the chamber kept at a higher temperature.

The present invention may also provide that a radiant energy source transmits energy to a work object thereby heating it. The surface of the heated work object radiates heat to a selected surface that becomes heated to the higher end of a temperature differential. The invention also provides that polysilicon may be etched off a surface that is transmissive of the radiant energy used to heat a work object in an RTP process chamber. One such transmissive surface may be the window between the radiant energy source and a work object. In the present invention, the etching of the transmissive surfaces occurs after they are heated by another object in the process chamber. That other object may be heated by the radiant energy source. Quartz surfaces in the chamber, including quartz liners and windows may be etched accordingly.

In another embodiment of the present invention, a method of cleaning an RTP process chamber is provided that includes the steps of heating a selected absorbent surface in the process chamber with energy from a radiant energy source, the radiant energy passing through a transmissive surface between the radiant energy source and the selected surface; allowing a selected transmissive surface in the chamber to heat by energy transferred from the selected absorbent surface, after the absorbent surface is heated by the radiant energy source; and contacting the heated transmissive surface with an etchant while there is a predetermined temperature differential between the selected transmissive surface and another selected surface in the chamber; and allowing sufficient time for the etchant to react preferentially at the transmissive surface to a predetermined degree relative to the other selected surface. Preferably, the selected absorbent surface comprises a wafer. The etchant in this embodiment may be $NF_3$ gas. The other surface may be on a component of a temperature measurement system, such as a reflectivity plate. This embodiment is suitable for etching deposits on the transmissive surface, including polysilicon deposits. This embodiment also provides that the other surface may be cooled by a cooling means so that it is at the lower end of the temperature differential. For certain processes, particularly cleaning polysilicon deposits with $NF_3$ gas or a similar etchant, it is advantageous to heat the selected absorbent surface to at least about 650° C. to about 750° C. so that it transfers sufficient heat to the selected transmissive surfaces to establish an appropriate temperature differential. More particularly, $NF_3$ gas may be used to clean polysilicon from the transmissive surface by providing a selected temperature differential between the surfaces of at least about 200° C. to about 500° C., with the temperature of the transmissive surface with the polysilicon deposits at the upper end of the differential and being at least about 650° C.

In still another embodiment of the present invention, a method of in situ cleaning of a process chamber is directed to running production wafers through a process chamber for depositing silicon on the wafers; stopping production runs for cleaning the chamber when silicon has deposited on the liner or a window of the chamber to a predetermined degree; heating a selected absorbent surface in the process chamber with energy from a radiant energy source, the radiant energy passing through a transmissive surface between the radiant energy source and the selected surface; allowing a transmissive surface in the chamber to heat by energy transferred from the selected absorbent surface; and, after a selected temperature differential has been established between the transmissive surface and another surface in the chamber, contacting an etchant present in the chamber with deposits on the transmissive surface. In this embodiment, as well as other embodiments, the selected absorbent surface may be on a silicon-based wafer. And the etchant may be $NF_3$ gas. In this embodiment, as well as others, the selected temperature differential between the selected surface and other surface may be at least about 200° C. Preferably, the selected temperature differential between the surfaces is from about 200° C. to 500° C. The temperature of the surface with the polysilicon or other material to be etched is at the upper end of the differential. A useful upper-end temperature for etching the selected surface with $NF_3$ gas is at least about 600° C. A preferable upper-end temperature for etching with $NF_3$ gas is about 600° C. to about 750° C. However, in other embodiments, the temperature of the surface at the upper end of the temperature differential may be in excess of about 1000° C., depending on the materials to be reacted.

Another embodiment of the present invention contemplates cleaning a semiconductor process chamber using a gas etchant. This embodiment is directed to heating an absorbent surface in the process chamber heat by energy from a radiant energy source, the absorbent surface being heated from about 400° C. to about 1500° C.; allowing a selected surface in the chamber to heat by energy transferred from the heated absorbent surface; and cooling another surface in the chamber so that there is a temperature differential between the cooled surface and the heated selected surface such that an etchant in the chamber reacts preferentially with the heated. Here again, the etchant may comprise $NF_3$ gas. The temperature differential between the surfaces is also preferably at least about 200° C.

As in other embodiments, the etchant may be $NF_3$ gas. Again, a suitable temperature differential between the selected surface and other surface is at least about 200° C.

The embodiments of the present invention are suitable for use in a cold-wall process chamber, particularly an RTCVD process chamber, used to form HSG capacitors on production wafers. When cleaning a process chamber of polysilicon deposits the polysilicon/silicon dioxide etching selectivity ratio may be in the range of about 4/1 to about 7/1, which will allow cleaning without unacceptable etching of other components in the chamber.

Other embodiments will be apparent to persons skilled-in the art, which embodiments do not depart from the spirit and scope of the present invention.

DETAILED DESCRIPTION OF THE INVENTION

In this invention, a process chamber is a vessel where processes are being performed to fabricate discrete devices or circuits on a work object. The process chamber may be used to oxidize, etch, dope, deposit, implant or pattern materials in or on the work object, as well as to clean, prepare and condition the work object, among other things. The present invention is preferably used to process work objects in an RTP process chamber for chemical deposition, where the work object is heated to a higher temperature than surrounding walls in the chamber.

"Work object" means objects, including, wafers (including production, dummy, or pmon), die and packaged parts, incorporating, in whole or part, silicon substrates, and other known or discovered semiconductor materials, components, and assemblies, including, for example, silicon-on-insulator (SOI), silicon-on-sapphire (SOS), thin film transistor (TFT) materials, or germanium, periodic group III-IV materials, II-VI materials, hetero-materials (II, III, V, VI), and conductive glasses.

The following description of a process chamber for Rapid Thermal Chemical Vapor Deposition ("RTCVD") processing of a semiconductor work object is intended to identify basic hardware features relevant to the discussion of the principles of the present invention. However, it will be apparent to those skilled in the art that the principles of the present invention may be applied to other kinds of semiconductor process chambers, particularly other RTP chambers for Plasma Enhanced Chemical Vapor Deposition ("PE-VCD"), Low Pressure Chemical Vapor Deposition ("LPCVD"), and other process systems. Likewise, while the principles of this invention may be discussed in terms of depositing polysilicon on, and etching it from, silicon based wafers or other surfaces in an RTCVD chamber, or in terms of using $NF_3$ gas as a reactant, the invention's principles, and the claims appended hereto, may apply to other processes, processing chambers, and reactants for semiconductor work objects.

Now using the example of an RTCVD system, such chambers are adapted for cycled rapid heating and cooling of sequentially introduced work objects. In an RTCVD chamber, a radiant energy source emits bursts of energy directed to a work object, rapidly heating the object to a substantially higher temperature than some or all of the surrounding surfaces in the chamber. A chemical reagent, usually a gas, is then introduced into the chamber to effect some process on the heated work object. An example process discussed herein is the deposition of polysilicon on a wafer to create HSG formations.

Figure 1:
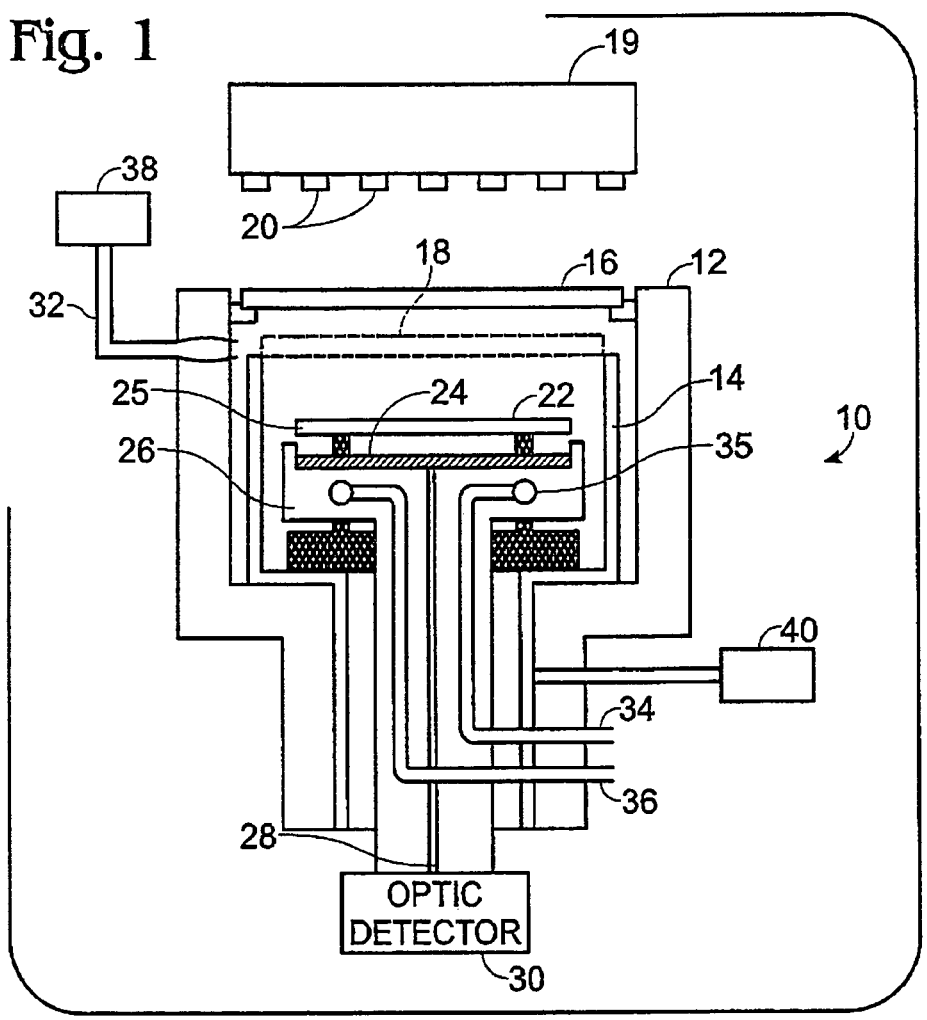
FIG. 1 shows an overview of an RTCVD semiconductor processing system in which the method of the present invention may be practiced.
Figure 2:
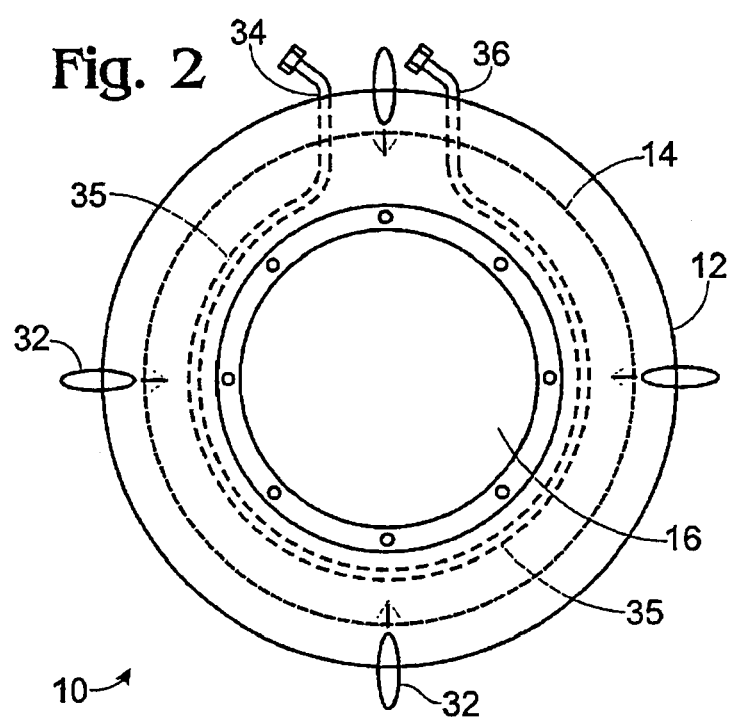
FIG. 2 is a top view of certain features of the processing chamber of the processing system of FIG. 1.
Figure 3:
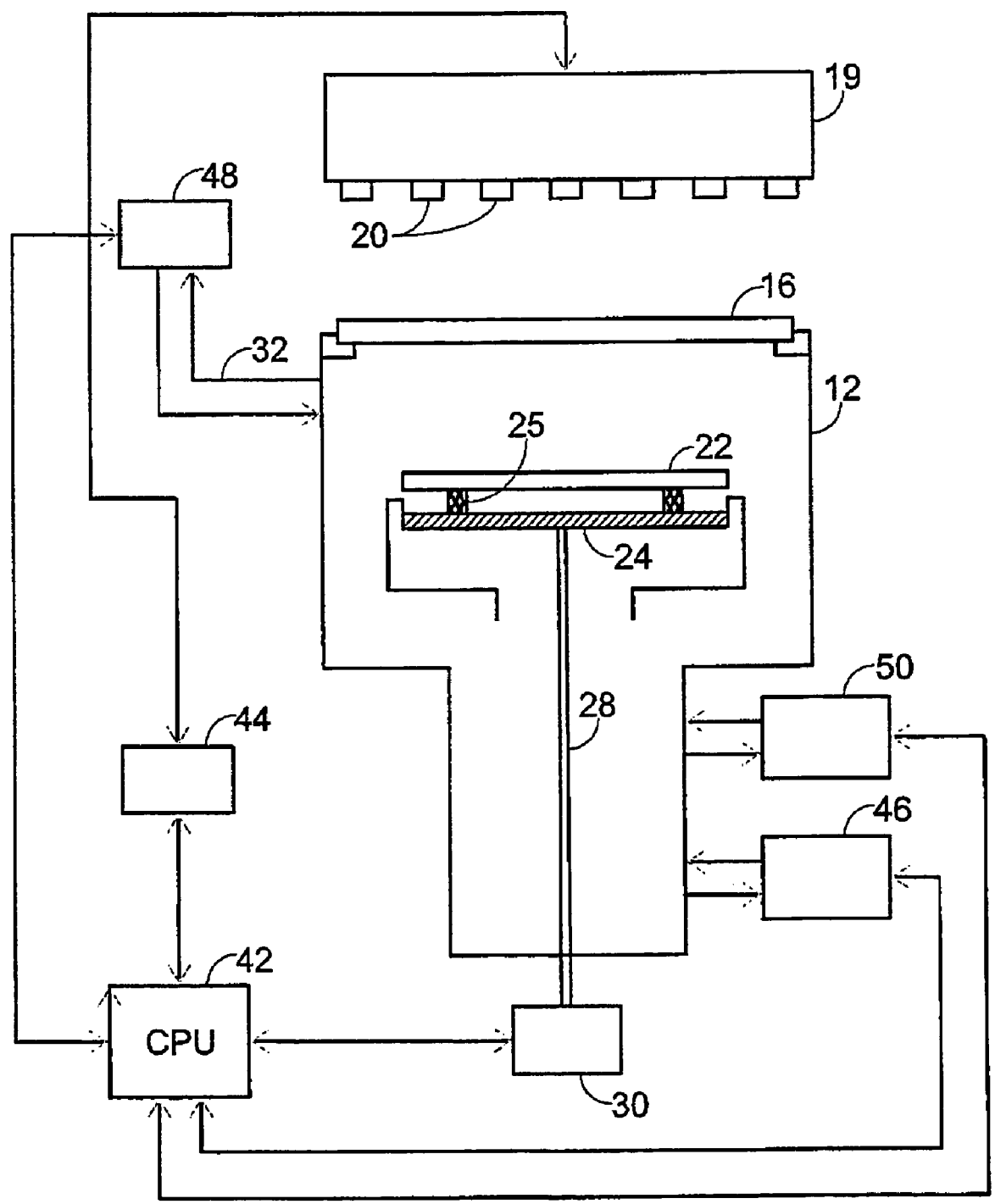
FIG. 3 shows process control units for controlling certain steps and conditions of the methods of the present invention

FIGS. 1–3 show basic details of an exemplary RTCVD chamber 10. The chamber 10 includes a cylindrical container 12 made of stainless steel, for example. A cylindrical liner 14 is disposed within container 12. The liner 14 is typically made of quartz. The container 12 has an opening at its top end for receiving a window 16. In RTCVD chambers, window 16 is typically made of quartz. A "shower head" 18, with a plurality of apertures for focusing radiant energy on an object in the chamber may optionally be disposed in an opening at the top end of liner 14. Showerhead 18 is also typically made of quartz.

A radiant energy source 19, including one or more high intensity elements 20 for producing electromagnetic radiation of a desired frequency and intensity sufficient to rapidly heat a silicon wafer or other semiconductor work object is positioned proximate to quartz window 16. The window 16 is transmissive of radiant energy from radiant energy source 19. Elements 20 typically may be tungsten-halogen lamps or other lamps capable of rapidly heating a semiconductor work object. Other possible radiant energy sources include plasma arc lamps, graphite heaters, and microwave units.

Lamps 20, quartz window 16, and optional showerhead 18, are arranged so that radiant energy is transmitted through window 16 and optional shower head 18 to a wafer or other work object 22 disposed on a wafer platform 26 at the bottom end of liner 14.

The wafer platform 26 (also referred to as a "cold head") for holding wafer 22 includes a reflectivity plate 24 disposed at the top of platform 26 directly below wafer 22. The reflectivity plate 24 typically comprises a parallel plate with a reflective coating that reflects energy received from radiant energy source 20 onto the backside of wafer 22. The reflectivity plate 24 also directs energy emitted from the backside of the wafer into one or more optical fibers 28. The wafer is held by the wafer platform on a pedestal 25 slightly above reflectivity plate 24. A spacing of about 1 cm is suitable. Optical fiber 28 transmits the collected energy to a detector 30. The temperature of platform 26, including the temperature of reflectivity plate 24, may be cooled or heated by a temperature control means discussed below. For example, the temperature of the wafer platform 26 may be conductively controlled by fluid flow through one or more channels 35 in platform 26. The rate of cooling or heating may be adjusted by changing the rate of flow or the temperature of the fluid.

One or more fluid lines 34 and 36 may be used to circulate a fluid, such as water, into a channel 35 for cooling or heating areas of the process chamber in conductive communication with channel 35.

The temperature measurement system includes reflectivity plate 24, detector 30 and one or more optical fibers 28 coupled to a detector 30 for converting the optical signals into a temperature reading. The detector 30 is capable of translating the frequencies of the electromagnetic radiation from wafer 22 into a signal or reading corresponding to the temperature of the wafer. The signal may be further transmitted to a central processing unit (CPU) 42 or a display means, such as a gauge. The signal may be analog or digital.

One or more lines 32 may be in communication with the inside of chamber 10 to introduce or remove gas or liquid reagents into the chamber for cleaning the inner surfaces of the chamber 10 or processing object 22. One such line is in communication with a reactant source 38. One reactant contemplated by the present invention, discussed in more detail below, is $NF_3$ gas.

Gas and fluid flow in the system may be controlled by appropriate pressure regulators, mass flow meters, valves, and timers (not shown). These control means may be in communication with CPU 42 or another processing unit.

One or more pumps 40 may be in communication with one or more gas or liquid reagent sources to introduce, remove, and/or circulate a reagent through chamber 10. For example, pump 40 may be used to evacuate chamber 10 of gas, other reagents, or by-products present in chamber 10 during or after cleaning.

The central processing unit ("CPU") 42 may be used to control various processes in chamber 10. The CPU 42 may be in the form of a PC computer, workstation, or other computer system known in the art. For example, based on signals received from detector 30, CPU communicates with a radiant energy controller 44 for controlling radiant energy source 19. CPU 42 could instruct radiant energy source 19 to turn on or off based on temperature measurement signals received from detector 30.

The CPU 42 may also be in communication with fluid line controller 46 to control the level and temperature of fluid flow into chamber 10. In addition to platform 26 and reflectivity plate 24 being in conductive communication with the cooling means, chamber 10 could be provided with additional fluid lines and channels of fluid flow to conductively control the temperature of other areas of the process chamber. CPU 42 or other CPUs may also communicate with other system components, including: etchant source controller 48 for controlling the flow of etchant gas into chamber 10; pump controller 50 for controlling the pumping of materials into or out of chamber 10 or to increase or lower the pressure in the chamber; and other mechanisms controlling or monitoring process steps or conditions. Of course, virtually any aspect of the process chamber and processes carried out therein, may be monitored and controlled, in whole or part, manually, by CPU 42, or by other CPUs integrated into the system.

One possible embodiment of the present invention will now be described. It is a method for cleaning deposits off surfaces in a RTCVD chamber used to process a semiconductor work object. The method is particularly suitable for cleaning an RTCVD chamber. And the cleaning method is particularly well suited for cleaning an RTCVD process chamber used to deposit polysilicon on a wafer to form selective HSG formations for memory storage devices, such as a DRAM device.

In the method, radiant energy source 19 is activated for one or more predetermined intervals to heat work object 22 to a desired temperature. (The use of radiant energy to heat a wafer object a predetermined degree is well known in the art and not discussed further herein.) The inner surfaces of the RTCVD chamber containing the wafer are substantially non-absorbent and/or transmissive of the radiant energy source used to heat the wafer. In a typical RTCVD chamber, these surfaces include the inner surfaces of liner 14, window 16 and, if present, shower head 18, all of which are usually made of quartz. Therefore, there is comparatively little, if any, direct heating of these surfaces by radiant energy source 19.

After the wafer is heated to a desired degree, the radiant energy source is switched off or set to a lowered level. At this point there is a first temperature differential between the wafer and the other surfaces in the chamber. The heated wafer then transfers its absorbed energy to the other components and parts in the chamber, including the quartz window. Wafer platform 26, which includes reflectivity plate 24, is not substantially affected by this heat transfer because it is cooled in a typical RTCVD system, such as shown in FIGS. 1–3, for example. Consequently, as the wafer transfers its heat to the quartz liner, window, and other components, those components reach a higher temperature than platform 26. Thus, during the heat transfer, a second temperature differential occurs between the surfaces in the chamber that have absorbed heat from the wafer and the surfaces in the cold head that are fluid cooled.

A temperature dependent reactant may be introduced at either the first or the second temperature differential to preferentially react at one more of the surfaces at one end of a temperature differential. If the reactant is introduced during the first temperature differential, the reactant will react preferentially with the wafer, if the reactant's reactivity increases with temperature. This reaction during the first temperature differential is of course a known technique; it is the intended purpose of RTP systems. (As a general rule reaction rates increase with temperature, but there are situations where reaction rates may decrease with increases in temperature: for example, a reactant may start to decompose beyond a particular temperature.)

Accordingly, in RTP systems, the present invention generally pertains to the second temperature differential based on heat transfer from the wafer or another energy absorbent surface to which the radiant energy source directs energy. As used herein, the term "temperature differential" means this second temperature differential, unless the context indicates that the first temperature differential is meant.

After the temperature differential is created, a reactant introduced into the chamber is contacted with different surfaces while there is an appropriate temperature differential between the surfaces. The reactant may be introduced once the temperature differential is established. Alternatively, the temperature differential may be created in the presence of the reactant, if the reactant does not adversely affect a selected surface before or during the creation of the temperature differential. There is a different rate of reaction at each surface during the temperature differential. The reaction is allowed to continue until the reactant has produced the desired process results on selected surfaces. The reactant may be removed from the chamber and/or the temperature at the selected surfaces may be adjusted to stop or slow the reaction at a selected surface. The reaction may also be carried out in one or more cycles.

$NF_3$ gas may be used as the reactant to clean an RTP process chamber. It reacts preferentially on surfaces at the higher end of the temperature range in an RTCVD process chamber. The $NF_3$ gas may react with a number of substrates in a process chamber, including silicon based substrates such as amorphous silicon, polysilicon, and silicon oxides. Other substances reactive with $NF_3$ are well known in the art, and include SiC, certain metals, etc. In addition to $NF_3$, other suitable etchants include HCl, $Cl_2$, other Cl containing gases, etc.

A dummy wafer may be used as the energy absorbent surface in an $NF_3$ etch process if production wafers being run through the chamber would have a low tolerance to any etching or otherwise would be damaged by the cleaning process. Likewise, the energy absorbent surface need not even be on the work object. It can be any object in the chamber that is designated to receive energy from the radiant energy source and which can transfer the energy to a selected surface to be processed.

There should be an appropriate spread between the higher and lower ends of the temperature differential. The appropriate spread will vary from situation to situation. Some factors that need to be considered in determining an appropriate spread include: the reaction rate of the reactants on the particular surfaces at temperatures and pressures maintained or maintainable in the process chamber, and the acceptable degree to which one or both surfaces will react. Using known techniques, persons of skill in the art generally may determine the reaction rates for a reactant at given temperatures on the substrate, or at given temperatures for different substrates. Using such information, a temperature differential of an appropriate spread may be determined and maintained for selected surfaces in the process chamber. For example the relative $NF_3$ etch rates for silicon and silicon dioxide are given in the example below. These etch rates show that $NF_3$ will preferentially etch polysilicon deposits on the quartz liner of an RTCVD chamber without unacceptable etching of any exposed quartz surfaces. In general, a temperature differential of at least 200° C. will be appropriate for $NF_3$ gas etching. Preferably the temperature differential is about 200° C. to about 500° C. when using $NF_3$ gas to clean quartz of polysilicon or similar deposits. The surface with the deposits, at the upper end of the temperature differential, should be at least about 600° C. A favorable temperature range has been found to be about 600° C. to about 750° C.

To provide such temperatures, a wafer or other object with an absorbent surface may need to be heated to a higher temperature than the desired upper end of the temperature differential in order to compensate for inefficiencies in the heat transfer. The absorbent surface can be heated by the radiant source up to at least about 1500° C. It is believed that if the absorbent surface is heated between about 400° C. to about 1500° C., there should be suitable heat transfer to cover most applications where the upper end of the desired temperature differential falls within this range.

In addition to the RTP heating systems, temperature differentials may also be created between selected surfaces in process chambers by other heating or cooling means, alone or in combination, including: conventional heat transfer means disposed in the process chamber, including conduction or convection heating systems; induction RF, plasma, and other radiant energy sources, including ultraviolet; conduction or convection cooling systems, including, refrigeration systems, fans, cooling fins, heat sinks; and other known forms of direct or indirect heat transfer to selected surfaces that may be implemented in a process chamber.

EXAMPLE EMBODIMENT OF THE INVENTION: CYCLED IN SITU CLEAN OF AN RTCVD PROCESS CHAMBER USING $NF_3$ GAS

The following is one example embodiment of the invention, which was tested by the inventor. The example is intended to help illustrate and further describe the foregoing principles of the invention. The information in the example embodiment is believed to be reasonably complete and accurate. Notwithstanding the inclusion of this example, the inventor believes the patentability of the present invention has been established independently of this example by the foregoing description and attached figures.

The following testing was carried out to determine if $NF_3$ gas could be used to clean an AGI Integra Pro clustered RTCVD process chamber of polysilicon deposits. The Integra Pro is manufactured by AG Associate Israel. The test evaluated whether the cleaning process would cause damage to the temperature measurement system or other components of the process chamber. The test also evaluated the impact of the cleaning process on production processes and yields, including whether unacceptable particle counts or other production problems resulted.

The Integra Pro process chamber was set up according to specifications of the assignee of this invention. FIGS. 1–3 generally illustrate relevant features of the Integra Pro. As seen in the Figures, a reflectivity plate collects the backside emissivity of a wafer disposed about 1 cm above the reflectivity plate. The reflectivity plate is disposed in a cold head with water-cooled channels that conductively cool the reflectivity plate. The coating of the reflectivity plate is degraded by $NF_3$ at temperatures in excess of about 600° C.

In this example, time and temperature measurements are based on the temperature of a dummy wafer. In the tests described in this example, it was assumed that the temperature of the reflectivity plate was substantially the same as the wafer, although the plate's temperature is actually somewhat lower because the wafer is not in direct contact with the cold head, while the reflectivity plate is. Any temperature difference, however, is not believed to be substantial in terms of the results and conclusions from this example.

The Integra Pro RTCVD process chamber was used to deposit polysilicon on eight-inch silicon wafers to form selective Hemispherical Grained Silicon ("HSG") formations for 16K or 64K DRAMS. Wafers were processed individually in the chamber. At intervals of about every 300 production wafers, it was desirable to clean polysilicon that accumulated on permanent or temporary surfaces in the process chamber. The quartz window and liner of the chamber are included among such surfaces.

Accordingly, after about 300 wafers were run, a dummy wafer was introduced into the process chamber. The dummy wafer was the same as a production wafer, except it was unpatterned. At the start of the cleaning cycle, the base temperature in the chamber was about 450° C. Over about five minutes, the temperature was ramped up to about 675° C. under a vacuum, creating a pressure of about $10^{-7}$ Torr.

Figure 4:
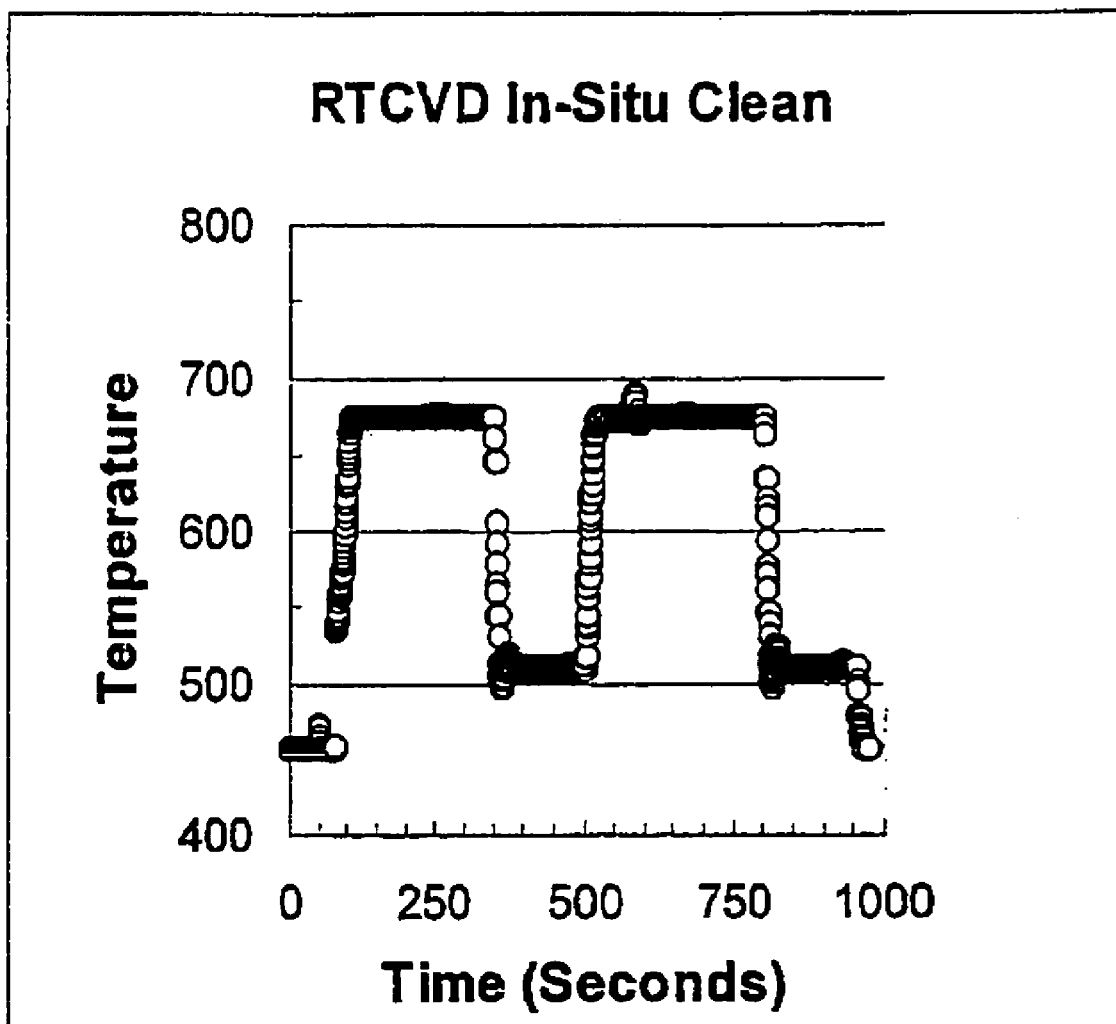
FIG. 4 is a plot of the temperature measured at the wafer/platform in an RTCVD chamber as a function of time that helps illustrate certain principles of an embodiment of the present invention.

FIG. 4 is a plot of the temperature of the wafer over time during the cleaning cycle. The introduction of the wafer into the chamber occurs at zero on the time axis of FIG. 4. The temperature ramp-up under vacuum is shown from about 50 to about 100 seconds. Alternatively, the temperature ramp-up could have been conducted under Nitrogen gas or other inert gas or gases. It also could have been conducted with $NF_3$ present because overetching of dummy wafers by $NF_3$ poses little concern.

After the temperature ramp-up, there is a high temperature step for the wafer. This is shown in FIG. 4 from about 100 to about 300 seconds. During the high temperature step, the top quartz window was heated by the energy radiating off the wafer. After about 300 seconds, the wafer platform (cold head) was cooled to about 500° C. $NF_3$ gas was then introduced into the chamber.

The gas was introduced into the chamber by a plurality of jets circumferentially disposed in the top of the chamber, as shown in FIG. 3.

The flow rate of $NF_3$ into the chamber was from about 1000–2000 standard cubic centimeters per minute ("SCCM"), and the chamber pressure was maintained at about $10^{-3}$ to about $10^{-4}$ Torr while the $NF_3$ gas was flowing in the chamber. During $NF_3$ flow, a pump withdrew gas and residuals through a port disposed near the bottom of the chamber. The above-stated pressure in the chamber was maintained by appropriate balancing of the gas inflow rate against the gas outflow rate from pump pull. The gas flow corresponded to the period of about 300 to about 500 seconds, seen in FIG. 4 as the lower temperature step of about 500° C.

During this lower temperature step, the temperature of the top quartz window was much higher than the cooled components of the chamber, particularly the reflectivity plate. (Temperature of quartz was approximated and not measured directly.) This was because the temperature measurement system was water-cooled, but the top quartz window was not. Consequently, the $NF_3$ etched polysilicon on the quartz window with comparatively little or no etching of the temperature measurement system. Etching of quartz begins at about 600–650° C. at the pressures stated herein. Thus, during the lower temperature step of the wafer, a temperature differential existed between the reflectivity plate and the quartz components in the chamber sufficient for the $NF_3$ to react preferentially at the quartz surface relative to the surface of the reflectivity plate. After about 500 seconds, the quartz cooled, diminishing the spread of the temperature differential, and ultimately reducing the etch rate to less than an effective rate. Therefore, $NF_3$ flow was stopped at about 550 seconds on the time axis of FIG. 4.

A second cycle of the foregoing steps was performed. The second cycle started with reheating the dummy wafer for a second high temperature step of about 675° C. (about 550 to about 800 seconds on FIG. 4's time axis). The wafer platform was then cooled again. And $NF_3$ gas flowed during a second lower temperature step of about 500° C (about 800 to about 1000 seconds on FIG. 4's time axis). Additional cycles could also have been performed as needed to further clean the process chamber.

Following the two cycles of cleaning with the dummy wafer, 25 additional dummy wafers were sequentially run through the process chamber under production conditions for forming selective HSG. The purpose of running these dummy wafers was to recondition the chamber for production. During reconditioning, residual matter from the $NF_3$ cleaning was removed from the chamber. The chamber was then visually inspected and found to be free of polysilicon on the top quartz window and quartz liner. The chamber was then deemed ready for continued production. Production runs after the cleaning showed that particle levels did not exceed maximum acceptable levels. It also showed that selective HSG formation was good. These results are discussed in more detail below.

Figure 5:
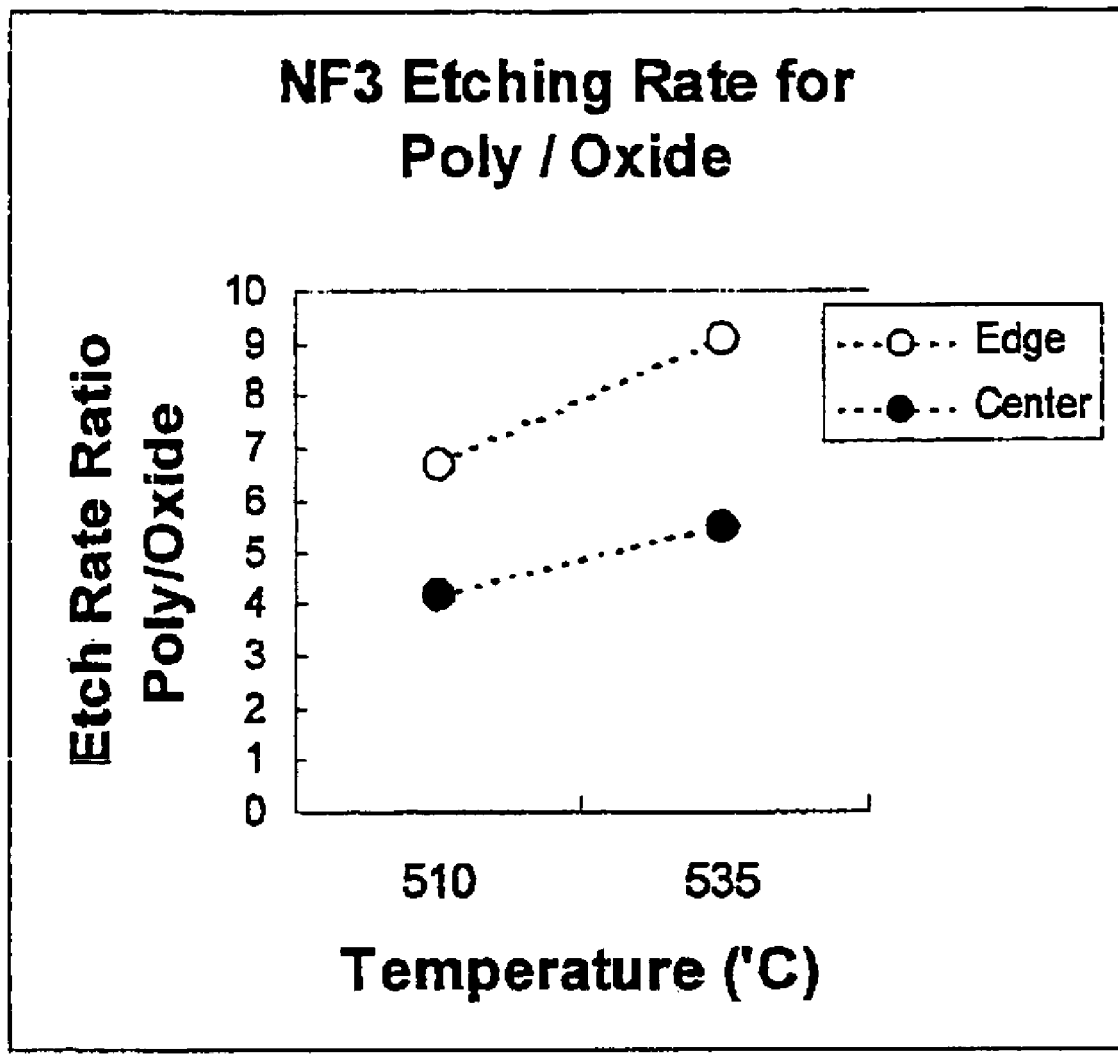
FIG. 5 is plot of the ratios of the $NF_3$ etch rates of polysilicon and silicon dioxide as a function of temperature to help illustrate certain principles of an embodiment of the present invention.

FIG. 5 shows the $NF_3$ etching rate ratio of polysilicon and oxidized silicon. The rates are based on measurement of $SiO_2$ on an 8" silicon wafer. These data indicate that at about 500° C., the lower temperature step for the wafer in FIG. 4 (or conversely the higher temperature step for the quartz), the $NF_3$ polysilicon/silicon dioxide etching selectivity ratio is about 4/1 to about 7/1. The upper plot in the graph with open data points shows the etch rate at about the edge of the wafer, the lower plot with darkened data points shows the etch rate at about the center of the wafer.

Figure 6:
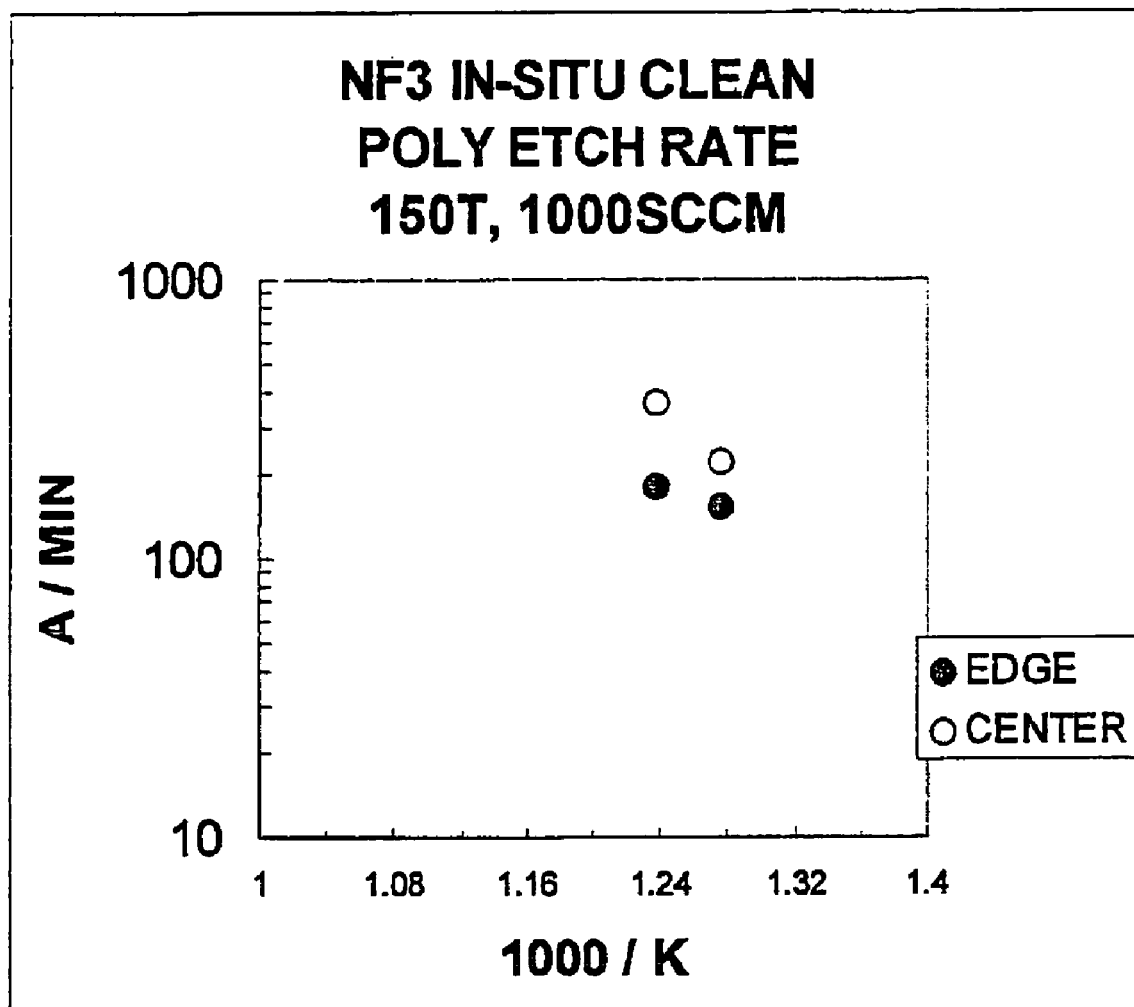
FIG. 6 is a plot of the $NF_3$ etch rate of polysilicon to help illustrate certain principles of an embodiment of the present invention.

FIG. 6 shows a semi-log graph of the etch rate of polysilicon in angstroms per minute as a function of temperature ($1000/°$ K). Open data points were from measurements taken at about the edge of an 8" wafer; darkened points were measurements taken at about the center of the wafer. The flow rate of $NF_3$ into the AGI Integra Pro was 1000 SCCM.

Figure 7:
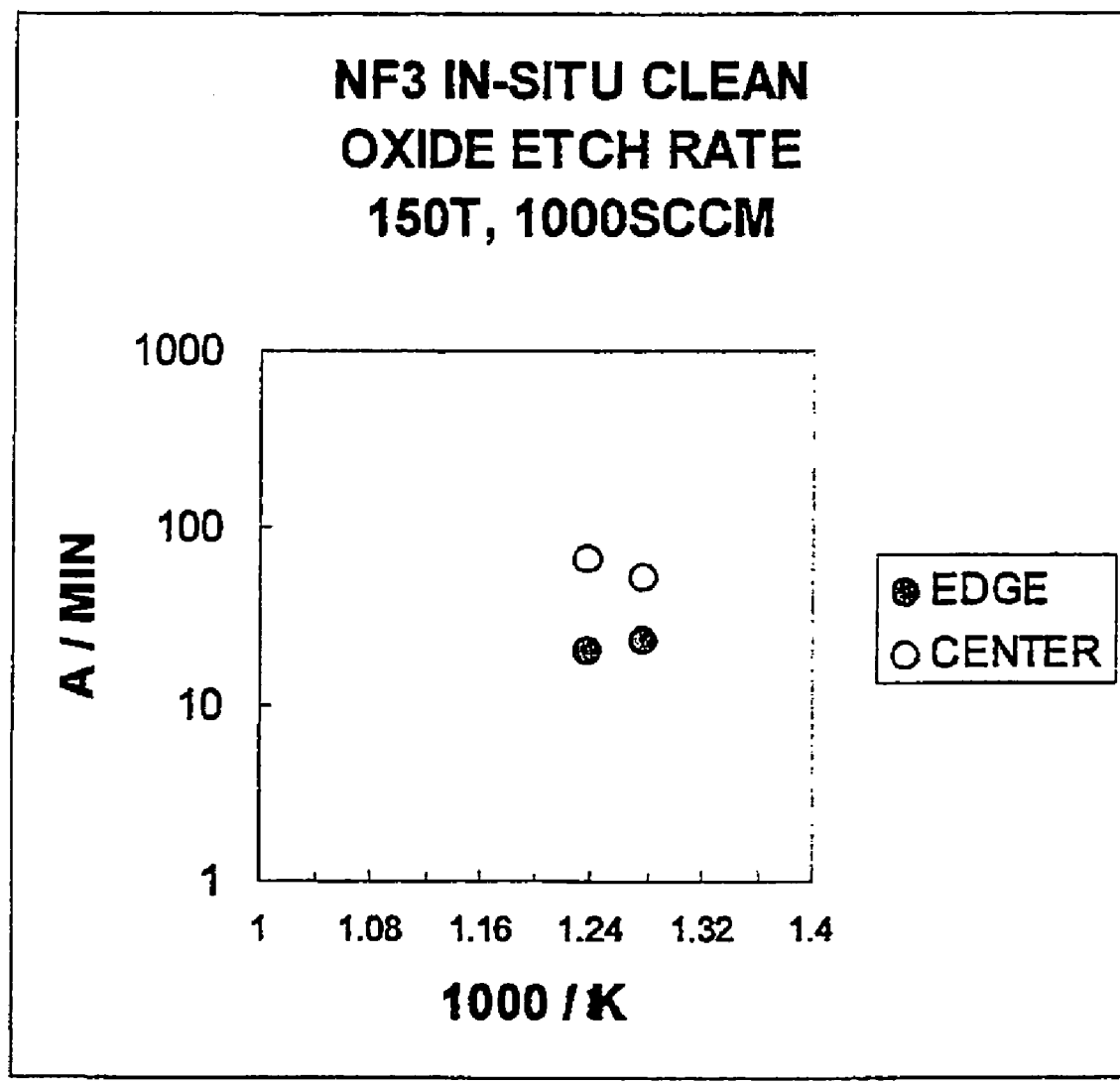
FIG. 7 is a plot of the $NF_3$ etch rate of silicon dioxide that helps illustrate certain principles of an embodiment of the present invention.

FIG. 7 shows a semi-log graph of the etch rate of an oxide layer on the wafer in angstroms per minute as a function of temperature (1000/° K). Open data points were from measurements taken near the edge of an 8" wafer; darkened data points were measurements taken near the center of the wafer. The flow rate of $NF_3$ into the AGI Integra Pro was 1000 SCCM.

A scanning electron microscope (SEM) was used to examine HSG formations on wafers run through the Integra Pro after $NF_3$ cleaning according to the foregoing example. The SEM images showed that both the HSG conversion and selectivity are good, producing uniform formations.

Figure 8:
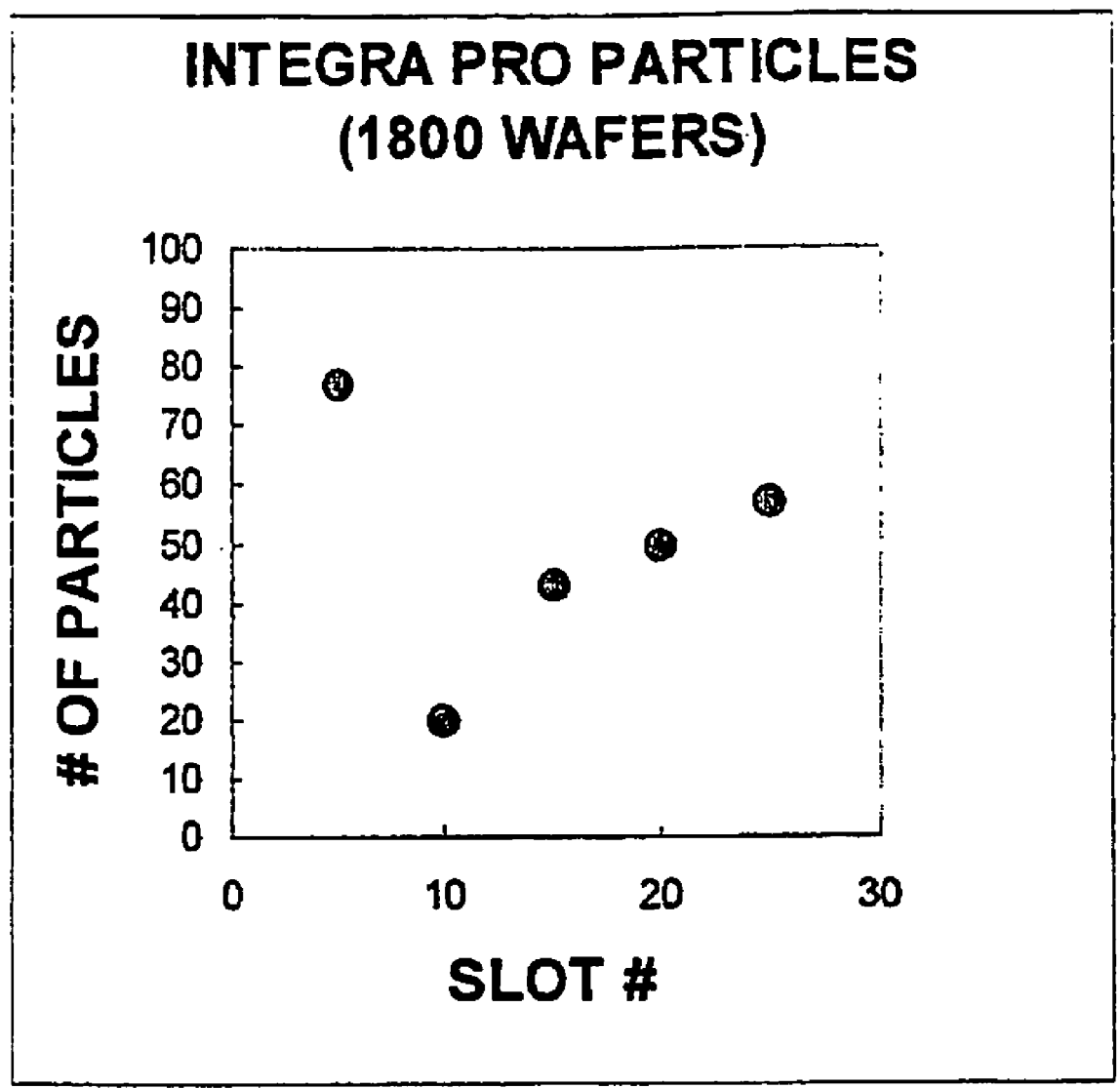
FIG. 8 is a plot of the average number of particles per wafer after a process chamber was cleaned with $NF_3$ gas according to an embodiment of the present invention.

FIG. 8 shows average particle counts on pmon wafers introduced into the chamber of an AGI Integra Pro after HSG processing of 1800 test wafers, with the $NF_3$ clean performed at an interval of every 300 test wafers. The wafers were as described in the above example. "Slot #" on the x-axis refers to the slot on a cassette from which a wafer was inserted into the chamber. As shown in FIG. 8, the average number of particles does not exceed acceptable levels after the $NF_3$ clean. (Counts under 100 particles per pmon wafer were considered acceptable.) The number of acceptable die per wafer also exceeded minimum standards and was maintained at a consistent level.

A marathon run of about 3000 wafers using the foregoing $NF_3$ cleaning procedure indicated that selective HSG capacitor formations maintain a 2× increase of capacitance over conventional smooth polysilicon capacitor formations.

Persons skilled in the art will recognize the foregoing description and embodiments are not limitations but examples. It will be recognized by persons skilled in the art that many modifications and variations to the present invention are possible that are still within the spirit and scope of the teachings and claims contained herein.

The invention claimed is:

1. A method of selectively cleaning a surface of a semiconductor process chamber, comprising:
    selecting two surfaces of the process chamber, one of the surfaces reacting with a reactant introduced into the chamber when the one surface has a temperature at or above a given temperature, wherein one of the surfaces comprises at least a liner or window surface of the chamber having deposits thereon;
    creating a predetermined temperature differential between the two surfaces by allowing a heated object in the chamber to transfer heating energy to the one surface so that the temperature of the one surface is at or above the given temperature and the other surface has a temperature below the given temperature;
    contacting the two surfaces with a reactant during the predetermined temperature so that the reactant acts on the one surface to remove the deposits;
    allowing sufficient time for the reactant to react preferentially with the one surface to a predetermined degree relative to the other surface to remove the deposits; and
    removing the deposits from the chamber.

2. The method of claim 1 further comprising a step of removing the reactant from the chamber after the reactant has reacted with the one surface.

3. The method of claim 1 wherein the method steps are repeated in the chamber following the processing of a predetermined number of work objects in the chamber.

4. The method of claim 1 wherein the object comprises a work object.

5. The method of claim 1 wherein the other surface is subject to cooling by a cooling device.

6. The method of claim 1 wherein the other surface is on a reflectivity plate, and the reactant does not react preferentially with the other surface.

7. The method of claim 4 wherein the one surface is a window surface through which radiant energy is transmitted to heat the work object, and the reactant reacts preferentially with the window surface.

8. The method of claim 6 wherein the reflectivity plate is cooled so that it has a temperature below the given temperature.

9. The method of claim 7 wherein the reactant comprises $NF_3$ gas.

10. The method of claim 1 wherein the heated object is heated by absorbing radiant energy from a source that transmits the radiant energy to the heated object, the heated object radiating the absorbed energy to the one surface.

11. The method of claim 10 wherein the other surface is cooled by a cooling device.

12. The method of claim 10 wherein the reactant comprises an etchant gas.

13. The method of claim 12 wherein the etchant gas comprises $NF_3$.

14. The method of claim 10 wherein the deposits are polysilicon deposits and the one surface is a quartz surface.

15. The method of claim 11 wherein the cooling device comprises a fluid cooling system in conductive communication with the other surface.

16. The method of claim 11 wherein the cooling device is in conductive communication with at least one component of a temperature measurement system.

17. The method of claim 12 wherein the etchant gas is used to clean polysilicon deposits off a quartz surface in the process chamber.

18. The method of claim 12 wherein the heated object comprises a work object and the one surface heated by heat radiating from the work object is transmissive to the radiant energy used to heat the work object.

19. The method of claim 18 wherein the transmissive surface comprises quartz.

20. The method of claim 19 wherein the quartz surface comprises a quartz window positioned between a radiant energy source in the system and the work object.

21. The method of claim 20 wherein the etchant gas comprises $NF_3$.

22. The method of claim 18 wherein the other surface is a surface on a component of a temperature measurement system.

* * * * *